(12) United States Patent
Hielscher et al.

(10) Patent No.: US 10,903,414 B2
(45) Date of Patent: Jan. 26, 2021

(54) DEVICE AND METHOD FOR GENERATING AN OSCILLATORY MOTION

(71) Applicant: Dr. Hielscher GmbH, Teltow (DE)

(72) Inventors: Harald Hielscher, Stahnsdorf (DE); Thomas Hielscher, Potsdam (DE); Holger Hielscher, Teltow (DE)

(73) Assignee: Dr. Hielscher GmbH, Teltow (DE)

( * ) Notice: Subject to any disclaimer, the term of this patent is extended or adjusted under 35 U.S.C. 154(b) by 335 days.

(21) Appl. No.: 15/603,724

(22) Filed: May 24, 2017

(65) Prior Publication Data

US 2017/0345991 A1 Nov. 30, 2017

(30) Foreign Application Priority Data

May 24, 2016 (DE) .................. 10 2016 109 502

(51) Int. Cl.
| | |
|---|---|
| *H01L 41/04* | (2006.01) |
| *B06B 1/02* | (2006.01) |
| *B06B 1/10* | (2006.01) |
| *H01L 41/09* | (2006.01) |
| *H04B 7/24* | (2006.01) |

(52) U.S. Cl.
CPC .......... *H01L 41/042* (2013.01); *B06B 1/0207* (2013.01); *B06B 1/10* (2013.01); *H01L 41/09* (2013.01); *H04B 7/24* (2013.01)

(58) Field of Classification Search
CPC ........ H01L 41/042; H01L 41/09; H01L 41/08
See application file for complete search history.

(56) References Cited

U.S. PATENT DOCUMENTS

| | | | | |
|---|---|---|---|---|
| 6,078,126 A | * | 6/2000 | Rollins | G04G 13/021 |
| | | | | 310/328 |
| 2007/0096594 A1 | * | 5/2007 | Maruyama | G06F 3/011 |
| | | | | 310/317 |
| 2008/0041604 A1 | | 2/2008 | Sauer | |
| 2015/0273638 A1 | | 10/2015 | Ketalaer | |
| 2016/0035964 A1 | | 2/2016 | Storm et al. | |
| 2017/0155029 A1 | * | 6/2017 | Kiyose | H01L 41/042 |

FOREIGN PATENT DOCUMENTS

| | | |
|---|---|---|
| DE | 102009008227 | 9/2013 |
| DE | 102012219254 | 1/2015 |
| EP | 3417789 | 12/2018 |
| FR | 1087922 | 3/1955 |
| FR | 2930648 | 10/2009 |
| SU | 757208 | 8/1980 |
| WO | WO 2006/002675 | 1/2006 |

OTHER PUBLICATIONS

Extended European Search Report for EP Application No. 17172767.0, dated Feb. 23, 2018, 8 pages.
Office Action for EP 17172767.0, dated Apr. 14, 2020, 5 pages.

* cited by examiner

*Primary Examiner* — Derek J Rosenau
(74) *Attorney, Agent, or Firm* — Ray Quinney & Nebeker P.C.; Paul N. Taylor

(57) ABSTRACT

The invention is directed to a device and to a method for generating an oscillatory motion of a mass, wherein an oscillating electrical signal and/or an operation power is wirelessly transmitted in order to facilitate retrofitting the device.

20 Claims, 5 Drawing Sheets

DEVICE AND METHOD FOR GENERATING AN OSCILLATORY MOTION

CROSS-REFERENCE TO RELATED APPLICATIONS

This application claims priority to and benefit of German Patent Application No. 102016109502.8, filed May 24, 2016, which is herein incorporated by reference in its entirety.

FIELD OF INVENTION

The present invention relates generally to devices and methods for generating an oscillatory motion of a mass.

BACKGROUND OF THE INVENTION

Devices for generating an oscillatory motion of a mass generally comprise an oscillator that is configured to transform an oscillating electrical signal into a mechanical oscillation. Furthermore, such devices generally comprise an oscillation generator that is configured to generate the oscillating electrical signal.

SUMMARY OF THE INVENTION

In accordance with one aspect of the present invention, there is provided a device for generating an oscillatory motion of a mass, comprising an oscillator that is configured to transform an oscillating electrical signal into a mechanical oscillation, an oscillation generator that is configured to generate the oscillating electrical signal. Furthermore, the device comprises a signal transmitting device for transmitting the oscillating electrical signal from the oscillation generator to the oscillator. The signal transmitting device comprises a signal sender and a signal receiver. The signal sender is configured to transmit the oscillating electrical signal to the signal receiver. The signal receiver is configured to transmit the received oscillating electrical signal to the oscillator. The signal sender is configured to transmit the oscillating electrical signal wirelessly to the signal receiver.

In accordance with another aspect of the present invention, there is provided a device for generating an oscillatory motion of a mass, comprising an oscillator that is configured to transform an oscillating electrical signal into a mechanical oscillation, and an oscillation generator that is configured to generate the oscillating electrical signal. The oscillation generator is connected to the oscillator in an oscillation electrical signal transmitting manner. The device further comprises a power source for providing operation power to the oscillation generator. The power source comprises a power sender and a power receiver. The power sender is configured to wirelessly send the operation power to the power receiver. The power receiver is configured to provide the wirelessly received power to the oscillation generator.

In accordance with yet another aspect of the present invention, there is provided a method for generating an oscillatory motion of a mass, comprising the step of wirelessly providing an oscillating electrical signal from an oscillation generator to an oscillator.

In accordance with yet another aspect of the present invention, there is provided a method for generating an oscillatory motion of a mass, comprising the step of providing an oscillating electrical signal from an oscillation generator to an oscillator, wherein the oscillation generator is wirelessly provided with operational power.

The methods may furthermore comprise the step transferring and mechanical oscillation generated by the oscillator upon receiving the oscillating electrical signal to the mass.

The characteristics, features and advantages of this invention and the manner in which they are obtained as described above, will become more apparent and be more clearly understood in connection with the following description of exemplary embodiments, which are explained in reference to the accompanying drawings, and which can readily be combined, unless explicitly stated to the contrary.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

In the drawings, same elements numbers indicated same elements in each of the views.

DETAILED DESCRIPTION

Figure 1:
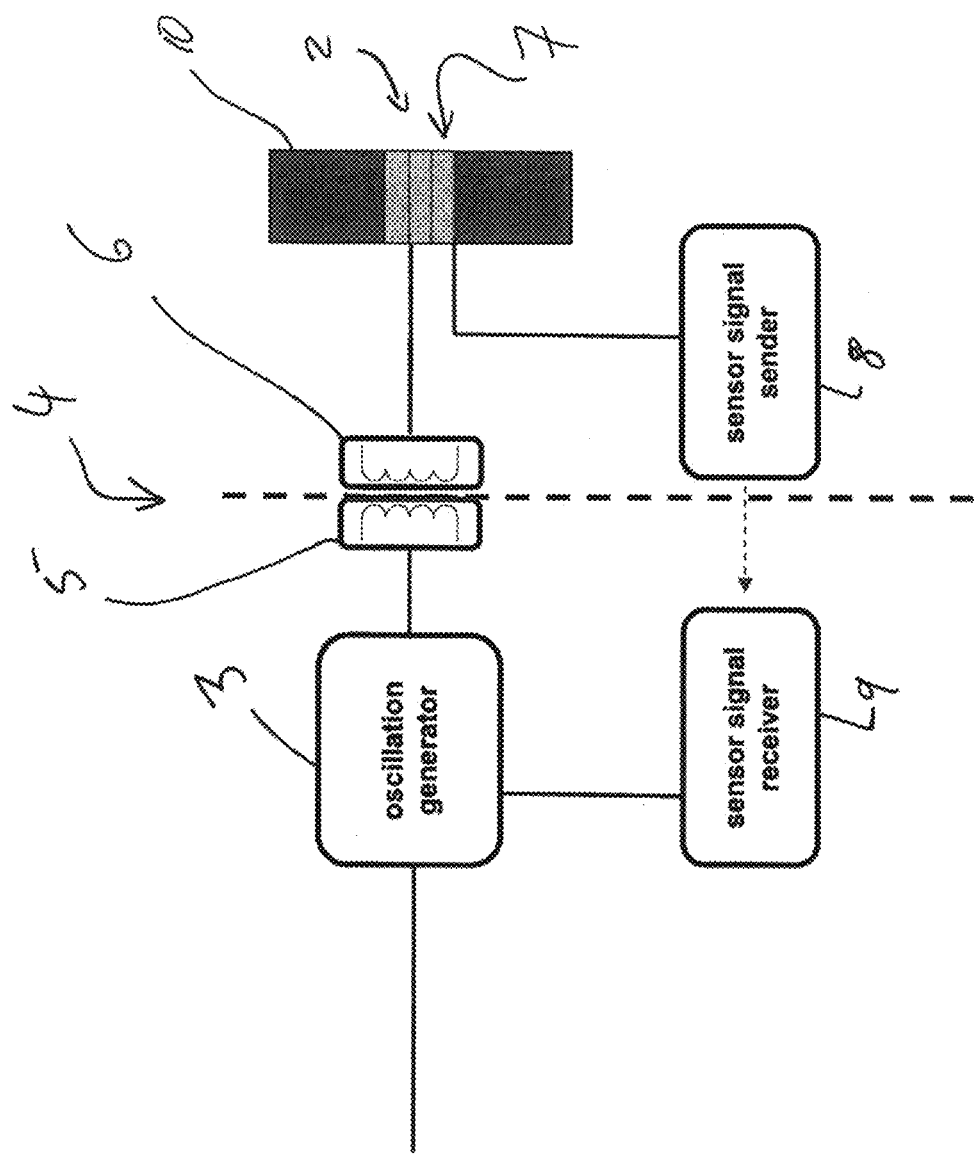
FIG. 1 is a schematic illustration of an exemplary device.

FIG. 1 shows an exemplary embodiment of a device 1 for generating an oscillatory motion of a mass. The device 1 comprises an oscillator 2 that is configured to transform an oscillating electrical signal into a mechanical oscillation. The oscillator 2 of the exemplary embodiment of FIG. 1, for example, is an ultrasonic oscillator and for example a piezo oscillator.

Moreover, the device 1 of the exemplary embodiment of FIG. 1 comprises an oscillation generator 3 that is configured to generate the oscillating electrical signal. The oscillation generator 3 is connected to the oscillator 2 in an oscillation electrical signal transmitting manner. In order to transmit the oscillation electrical signal from the oscillation generator 3 to the oscillator 2, the device 1 comprises a signal transmitting device 4. The signal transmitting device 4 is adapted to transmit the oscillation electrical signal wirelessly. In particular, the signal transmitting device 4 comprises a signal sender 5 and a signal receiver 6. The signal sender 5 is configured to transmit the oscillating electric signal to the signal receiver 6 in a wireless manner. For example, the signal sender 5 is a wire coil. The signal receiver 6 is configured to wirelessly receive the oscillating electrical signal sent by the signal sender 5 and to transform the wirelessly received oscillating electrical signal into an oscillating electrical signal that may essentially correspond to the oscillating electrical signal generated by the oscillation generator 3. For example, the signal receiver 6 is a wire coil.

The signal sender 5 and the signal receiver 6 may not be mechanically affixed to each other, such that the signal sender 5 and the signal receiver 6 are provided separate from each other and can be readily moved away from each other.

Optionally, the device 1 may comprise an oscillation sensor 7. The oscillation sensor 7 is configured to sense a predetermined feature of the mechanical oscillation of the oscillator 2. For example, the predetermined feature of the mechanical oscillation may be its amplitude or its phase.

The oscillation sensor 7 can be connected to the oscillation generator 3 in a sensor signal transmitting manner. For example, the oscillation sensor 7 can be connected to the oscillation generator 3 in a wired manner. Alternatively, the oscillation sensor 7 can be connected to the oscillation generated 3 in a wireless manner. For example, the device 1 may comprise a sensor signal sender 8 and a sensor signal receiver 9. The sensor signal sender 8 and the sensor signal receiver 9 may for example be adapted to transmit the sensor signal as an optical or as a radio signal.

The oscillation generator 3 may be adapted to set a feature of the oscillating electrical signal dependent on the predetermined feature of the mechanical oscillation represented by the sensor signal.

The oscillator 2 is connected to a mass 10 in a motion-transmitting manner. For example, the oscillator 2 is mechanically coupled and for example attached or affixed to the mass 10. Mechanical oscillations or vibrations performed by the oscillator 2 are transmitted to the mass 10, which may follow the mechanical oscillations or vibrations of the oscillator 2.

The mass 10 may be a part of the device 1, wherein the mass 10 may be a tool holder for holding a tool, a holder for a reactor for holding a reactor, e.g. vessel, a holder for a conduit, e.g. a pipe, a reactor, e.g. a vessel, or a conduit, e.g. a pipe. The tool may be a tool for cutting a work piece, e.g. for forming or shaping the work piece by drilling, lathing or other mechanical forming processes.

In case the device 1 is adapted to move and for example to rotate the mass 10 relative to the oscillation generator 3, the signal receiver 6 and optionally also the oscillation sensor 7 and the sensor signal sender 8 can be connected to the mass 10 in a motion transmitting manner and can, thus, be moved together with the mass 10 an independent of the oscillation generator 3 and/or the signal sender 5.

Figure 2:
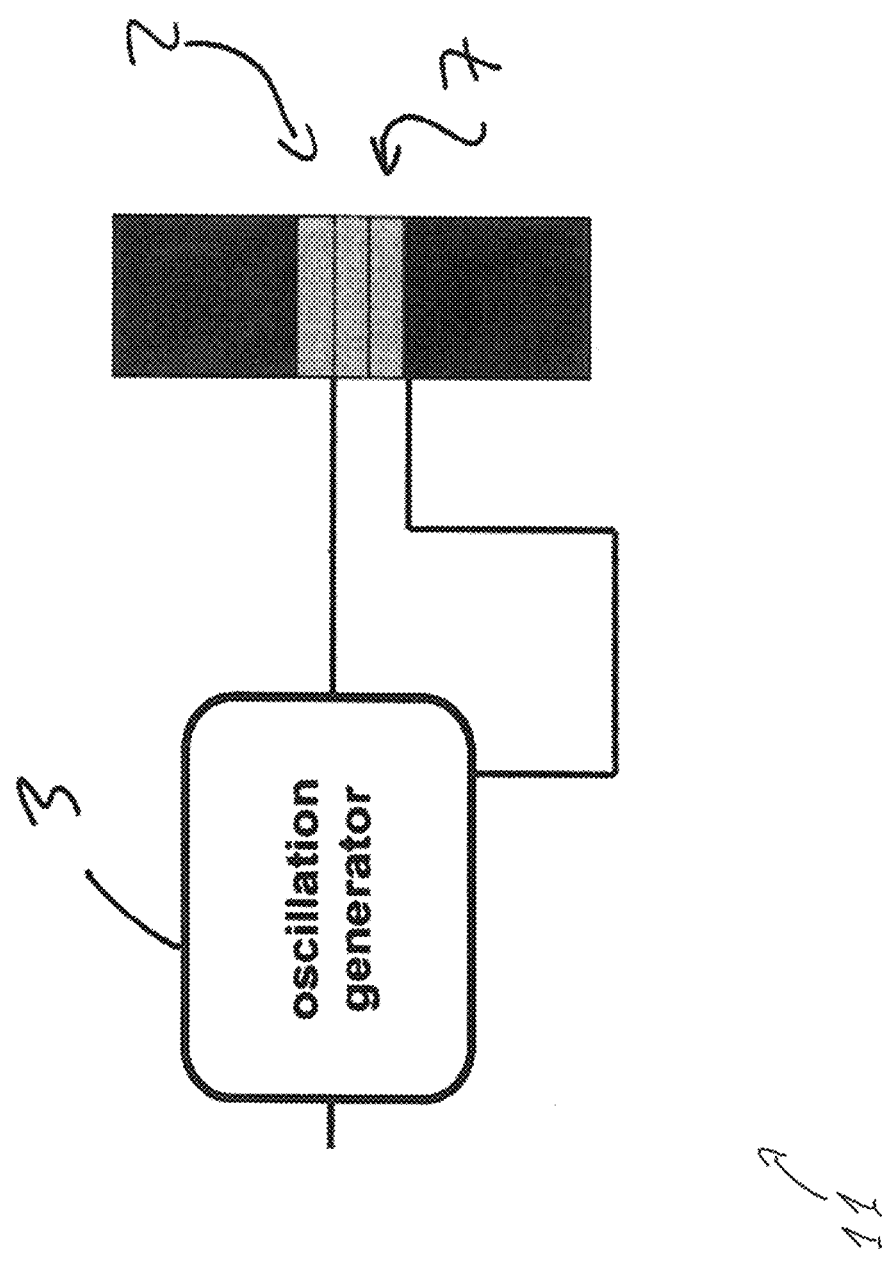
FIG. 2 is a schematic illustration of another exemplary device.

FIG. 2 schematically shows another embodiment of the device 11. The device 11 comprises the oscillator 2 and the installation generator 3. Optionally, the device 11 also comprises the oscillation sensor 7. The oscillation generator 3 and the oscillator 2 are electrically interconnected in a wired manner, for example via a rotary union, a sliding contact or a wiper contact. The optional oscillation sensor 7 and oscillation generator 3 are electrically interconnected in a wired manner, for example via a rotary union, a sliding contact or a wiper contact.

Figure 3:
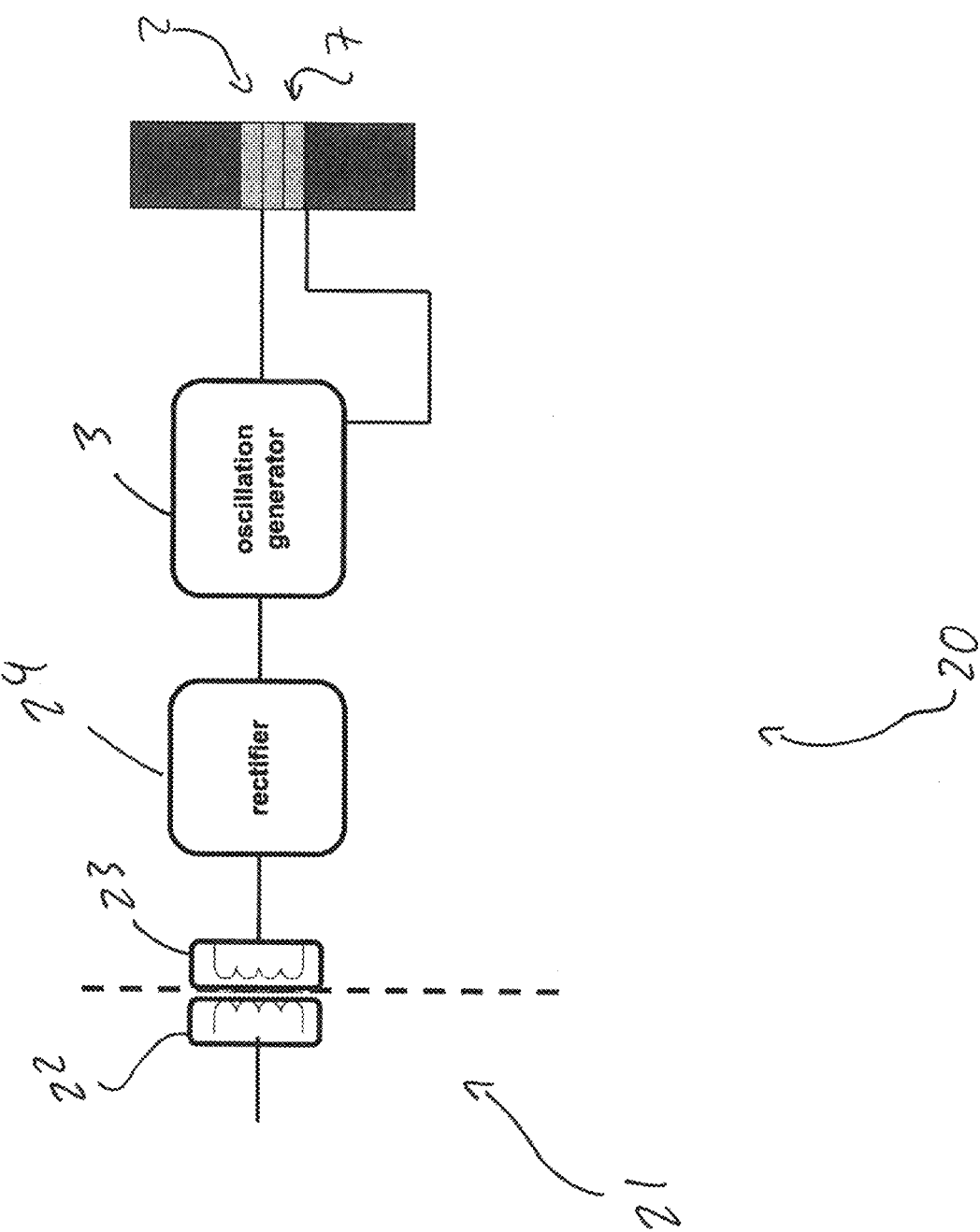
FIG. 3 is a schematic illustration of yet another exemplary device.

FIG. 3 schematically shows another embodiment of the device 20. The device 20 comprises the oscillator 2 and the installation generator 3. Optionally, the device 20 also comprises the oscillation sensor 7. As an alternative or in addition to the exemplary embodiment of FIG. 1, the device 20 of the exemplary embodiment of FIG. 2 comprises a power source 21 for wirelessly providing the oscillation generator 3 with operation power. The power source 21 comprises a power sender 22 and a power receiver 23. The power sender 22 is configured to wirelessly send the operation power to the power receiver 23. The power receiver 23 is configured to provide the wirelessly received operation power to the oscillation generator 3.

A rectifier 24 may optionally be connected in series between the power receiver 23 and the oscillation generator 3. As a further possible alternative, the oscillation generator 3 and the oscillator 2 may be connected to each other in a wired manner or in a wireless manner by the signal transmitting device of the exemplary embodiment of FIG. 1. Additionally, the oscillation sender 7 may be connected to the oscillation generator 3 in a wired or in a wireless manner.

Figure 4:
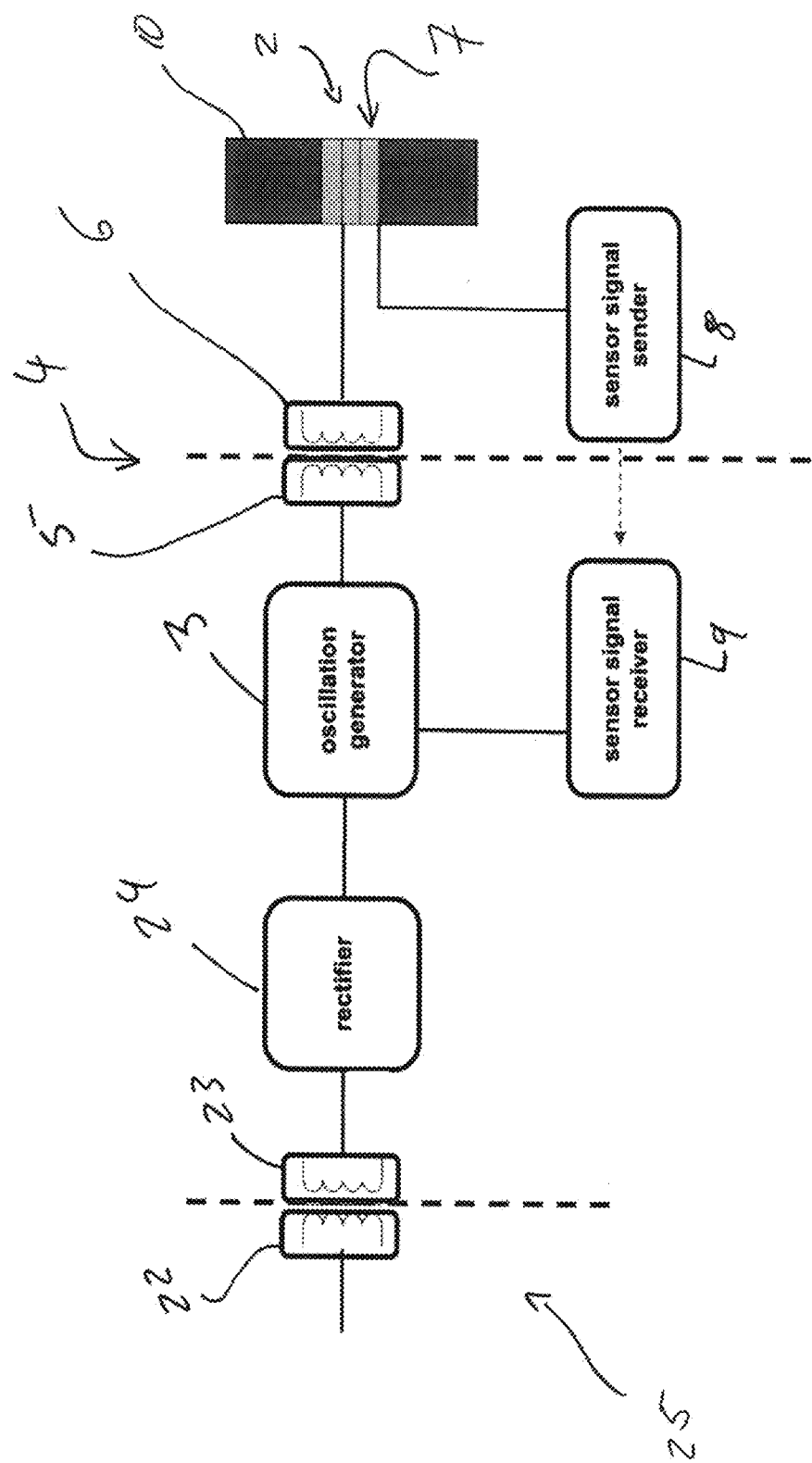
FIG. 4 is a schematic illustration of yet another exemplary device.

FIG. 4 schematically shows another embodiment of the device 25. The device 25 essentially comprises the device 1 of the exemplary embodiment of FIG. 1, wherein the exemplary embodiment of FIG. 4 additionally comprises a power source 21 for wirelessly providing the oscillation generator 3 with operation power of the exemplary embodiment of FIG. 3. The power source 21 comprises a power sender 22 and a power receiver 23. The power sender 22 is configured to wirelessly send the operation power to the power receiver 23. The power receiver 23 is configured to provide the wirelessly received operation power to the oscillation generator 3.

Figures 5, 6:
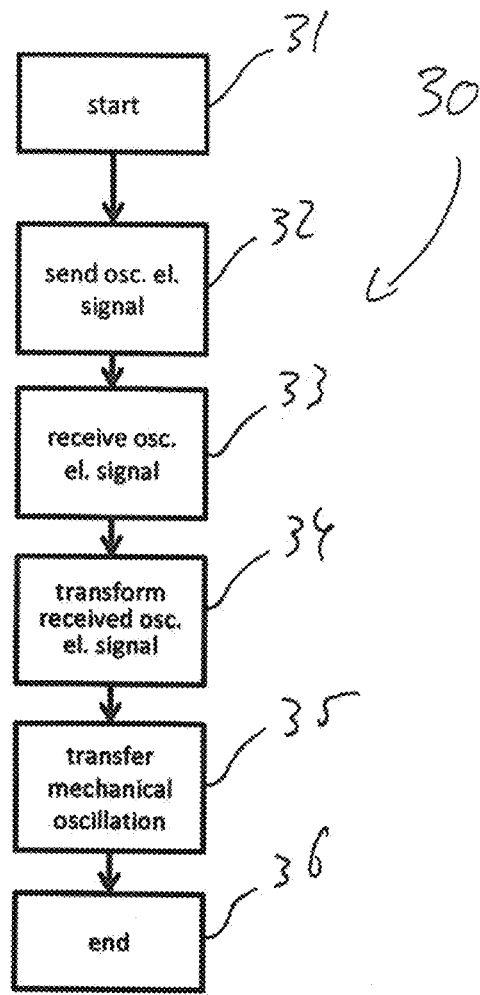
FIG. 5 is a schematic view of an exemplary method.
FIG. 6 is a schematic view of another exemplary method.

FIG. 5 schematically shows an embodiment of a method 30 for generating an oscillatory motion of a mass as a flowchart.

The method 30 starts with a first method step 31. In the first method step 31, for example, the oscillating electrical signal is generated by the oscillation generator 3.

As the next step, the method 30 comprises the step 32, in which the oscillating electrical signal is wirelessly sent, for example by the signal sender 5. Next, the sent oscillating electrical signal is wirelessly received in a method step 33, for example by the signal receiver 6. In the following method step 34, the wirelessly received oscillating electrical signal is transformed into a mechanical oscillation or vibration, for example by the oscillator 2, which may be provided with the wirelessly received oscillating electrical signal, for example in a wired manner. The mechanical oscillation is transferred to the mass 10 in the following method step 35. As soon as possible the mass is not required to oscillate or vibrate anymore, the method 30 ends with method step 36.

FIG. 6 schematically shows another embodiment of a method 40 for generating an oscillatory motion of a mass as a flowchart.

The method 40 starts with a first method step 41. In the first method step 41, for example, the device 20 is connected to a source of operation power.

As a next step, the method 40 comprises a method step 42, in which the operation power is wirelessly sent, for example by the power sender 22. In the following method step 43, the operation power is wirelessly received, for example by the power receiver 23. In the following method step 44, the operation power is, then, provided or output, for example by the power receiver 23, to the installation generator 3, either directly or indirectly, for example via the rectifier 24.

Method steps 42, 43 and 44 may also be part of the previously described method 30 and may be performed between method steps 31 and 32.

After the method step 44, method 40 comprises the methods that 45, in which the oscillating electrical signal is generated, for example by the oscillation generator 3. After generating the oscillating electrical signal, the oscillating electrical signal is transformed into a mechanical oscillation or vibration in method step 46, for example by the oscillator 2. The mechanical oscillation is transferred to the mass 10 in the following method step 47. As soon as the mass is not required to oscillate or vibrate anymore, the method 40 ends with method step 48.

In summary, in one aspect, a device for generating an oscillatory motion of a mass is provided. The device comprises an oscillator that is configured to transform an oscillating electrical signal into a mechanical oscillation. Furthermore, the device comprises an oscillation generator that is configured to generate the oscillating electrical signal. Moreover, the device comprises a signal transmitting device for transmitting the oscillating electrical signal from the oscillation generator to the oscillator. The signal transmitting device comprises a signal sender and a signal receiver. The signal sender is configured to wirelessly transmit the oscillating electrical signal to the signal receiver. The signal receiver is configured to transmit the wirelessly received oscillating electrical signal to the oscillator.

Due to the wireless transfer of the oscillating electrical signal, the oscillator can be readily removed from the oscillation generator, thereby facilitating retrofitting or modifying the device.

In summary, in another aspect, a device for generating an oscillatory motion of a mass is provided. The device comprises an oscillator that is configured to transform an oscillating electrical signal into a mechanical oscillation. Furthermore, the device comprises an oscillation generator that is configured to generate the oscillating electrical signal and that is connected to the oscillator in an oscillation electrical signal transmitting manner. Moreover, the device comprises a power source for providing operational power to the oscillation generator. The power source comprises a power sender and power receiver. The power sender is configured to wirelessly send the operation power to the power receiver. The power receiver is configured to provide the wirelessly received operation power to the oscillation generator.

Due to the wireless transfer of operation power, the oscillator can be readily removed from a source of the operation power connected to the power sender, thereby facilitating retrofitting or modifying the device.

In summary, in yet another aspect, a method for generating an oscillatory motion of a mass is provided. The method comprises the step of wirelessly providing an oscillating electrical signal from an oscillation generator to an oscillator.

Due to the wireless transfer of the oscillating electrical signal, the oscillator can be readily removed from the oscillation generator, thereby facilitating retrofitting or modifying the device.

In summary, in yet another aspect, a method for generating an oscillatory motion of a mass is provided. The method comprises the steps of providing an oscillating electrical signal from an oscillation generator to an oscillator, and of wirelessly providing the oscillation generator with operation power.

Due to the wireless transfer of operation power, the oscillator can be readily removed from a source of the operation power connected to the power sender, thereby facilitating retrofitting or modifying the device.

Unless explicitly stated to the contrary, the embodiments can be combined as desired and further improved by the further following embodiments of implementations that are advantageous on their own, in each case.

According to an embodiment, the device comprises an oscillation sensor that is configured to sense a predetermined feature of the mechanical oscillation of the oscillator, and to output a sensor signal representing the predetermined feature of the mechanical oscillation, wherein the oscillation sensor is connected to the oscillation generator in a sensor signal transmitting manner. Due to the oscillation sensor, deviations of the at least one predetermined feature from a nominal value, for example caused by a mechanical load acting on the oscillator and/or on the mass, can be detected and communicated with the oscillation generator.

According to an embodiment, the oscillation generator is configured to set a feature of the oscillating electrical signal dependent on the predetermined feature of the mechanical oscillation represented by the sensor signal. Thus, it may be possible to adjust the oscillating electrical signal such that the at least one predetermined feature of the mechanical oscillation corresponds to the nominal value, wherein the nominal value may be a nominal range, even if a mechanical load is applied to the oscillator and/or to the mass. Moreover, due to sensing and transmitting the predetermined feature of the mechanical oscillation, retrofitting, for example by exchanging the mass by another mass, is facilitated, as the oscillating electrical signal can automatically be adapted to the other mass by the oscillation generator based on the at least one predetermined feature of the mechanical oscillation represented by the sensor signal.

According to an embodiment, the oscillation sensor is connected to the oscillation generator in a wired or wireless sensor signal transmitting manner. Hence, the sensor signal can be easily transmitted from the oscillation sensor to the oscillation generator. Wired connection can be realized cheap, for example via a rotary union, a sliding contact or a wiper contact. In case the connection is wireless, retrofitting the device is further facilitated, as no wired connection needs to be opened and closed when retrofitting the device.

According to an embodiment, the signal receiver and the oscillator form an oscillation system or module that is configured to be repeatedly separated and connected to the power system or module of the device, the power system comprising the signal sender. Hence, it may be possible to even more easily retrofit the device, as the oscillation system can be readily removed from the power system, for example in order to replace the oscillation system by another oscillation system, which may be equipped with a mass that differs from the mass of the respective other oscillation system.

According to an embodiment, the power system is provided outside of the oscillation system. Thus, in case the device is to be retrofitted, the power system and the oscillation system can be easily separated from each other. Forming the device with the oscillation system and the power system as modules further facilitates retrofitting the device.

According to an embodiment, the power receiver and the oscillator form an oscillation system that is configured to be repeatedly separated from and connected to the power system that comprises the power sender. Optionally, the signal generator and/or the sensor are part of the oscillation system. Forming the device with the oscillation system and the power system as modules further facilitates retrofitting the device.

According to an embodiment, the device comprises a mass that is connected to the oscillator in a mechanical oscillation transmitting manner. The mass can for example be one of a tool holder, a reactor holder, a conduit holder, a tool, a reactor and a conduit. The mass can be affixed the oscillator. For example, the oscillator can be an integral part of the mass.

According to an embodiment, for example, a reactor can be a vessel for liquids to be treated with the mechanical oscillation. According to an embodiment, for example, a conduit can be hose or pipe. According to an embodiment, for example, a tool can be a horn or a sonotrode for emitting the mechanical oscillation to a solid body or a liquid. According to an embodiment, for example, the mass ma be a tool for cutting a workpiece, for example by drilling, milling or lathing.

According to an embodiment, the power source and the power sender form a voltage transformer, which is readily available at low cost.

According to an embodiment, the oscillator, the optional mass, the optional oscillation sensor and/or the optional sensor signal sender are coupled to the signal receiver and/or to each other in a motion transmitting manner, such that the oscillator, the mass, the optional oscillation sensor and/or the optional sensor signal sender as well as the signal receiver are movable with respect to the oscillation generator, the signal sender and the optional sensor signal receiver.

According to an embodiment, the oscillator, the optional mass, the optional oscillation sensor and/or the optional rectifier are coupled to the power receiver and/or to each other in a motion transmitting manner, such that the oscillator, the optional mass, the optional oscillation sensor and/or the optional rectifier as well as the power receiver are movable with respect to power sender.

According to an embodiment, being movable means being rotatable around an axis.

According to an embodiment, the method is a method for processing a workpiece by bringing the workpiece in mechanical contact with the mass while the mass performs the mechanical oscillations.

The frequency at which the oscillating electrical signal oscillates may be designated as excitation frequency. According to an embodiment, the excitation frequency essentially corresponds to the resonant frequency of the oscillator or of the oscillator and the mass, optionally including the oscillation sensor. In particular, the excitation frequency may be in a range between 80% and 120% of the resonant frequency.

According to an embodiment, the mechanical oscillator is an ultrasound oscillator oscillating at ultrasound frequencies.

According to an embodiment, the mass is a laser for laser cutting, laser welding or for laser burning.

According to an embodiment, the mass is a tool for cleaning a surface.

According to an embodiment, the mass is a tool for grinding, sawing, polishing or honing.

According to an embodiment, the method for generating an oscillatory motion of a mass comprises the step of oscillating the mass such that cavitation occurs in a liquid that contacts the mass.

According to an embodiment, the frequency at which the oscillating electrical signal oscillates is between 1 Hz and 1 MHz, for example between 16 kHz and 80 kHz.

REFERENCE SIGNS 1 device
2 oscillator
3 oscillation generator
4 signal transmitting device
5 signal sender
6 signal receiver
7 oscillation sensor
8 sensor signal sender
9 sensor signal receiver
10 mass
11 device
20 device
21 power source
22 power sender
23 power receiver
24 rectifier
25 device
30 method
31 start
32 wirelessly send oscillating electrical signal
33 wirelessly receive oscillating electrical signal
34 transform oscillating electrical signal into mechanical oscillation
35 transfer mechanical oscillation to mass
36 end
40 method
41 start
42 wirelessly send operation power
43 wirelessly receive operation power
44 output operation power
45 generate oscillating electrical signal
46 transform oscillating electrical signal into mechanical
47 transfer mechanical oscillation to mass
48 end

What is claimed is:

1. A device for generating an oscillatory motion of a mass, comprising:
   an oscillator that is configured to transform an oscillating electrical signal into a mechanical oscillation;
   an oscillation signal generator that is configured to generate the oscillating electrical signal; and
   a signal transmitting device for transmitting the oscillating electrical signal as generated by the oscillation signal generator to the oscillator, wherein the signal transmitting device comprises:
   a signal sender; and
   a signal receiver, the signal sender being configured to directly transmit the oscillating electrical signal as generated by the oscillation signal generator to the signal receiver, and the signal receiver being configured to transmit the received oscillating electrical signal as transmitted by the signal sender to the oscillator, wherein the signal sender is configured to transmit the oscillating electrical signal wirelessly to the signal receiver.

2. The device of claim 1, wherein the device comprises an oscillation sensor that is configured to sense a predetermined feature of the mechanical oscillation of the oscillator, and to output a sensor signal representing the predetermined feature of the mechanical oscillation, wherein the oscillation sensor is connected to the oscillation signal generator in a sensor signal transmitting manner.

3. The device of claim 2, wherein the oscillation signal generator is configured to set a feature of the oscillating electrical signal dependent on the predetermined feature of the mechanical oscillation represented by the sensor signal.

4. The device of claim 2, wherein the oscillation sensor is connected to the oscillation signal generator in a wired or wireless sensor signal transmitting manner.

5. The device of claim 1, wherein a power system is provided outside of an oscillation system formed by the signal received and the oscillator.

6. The device of claim 1, wherein the device comprises a mass that is connected to the oscillator in a mechanical oscillation transmitting manner, wherein the mass is one of a tool holder, a reactor holder, a conduit holder, a tool, a reactor and a conduit.

7. The device of claim 1, wherein a frequency of the frequency at which the oscillating electrical signal oscillates range between 80% and 120% of the resonant frequency of the oscillator or of the oscillator and the mass, optionally including an oscillation sensor.

8. The device of claim 1, wherein the signal receiver and the ultrasonic oscillator form an oscillation module that is configured to be repeatedly separated from and connected to a power module of the device, a power module system comprising the signal sender.

9. The device of claim 1, wherein the signal transmitting device transmits the oscillating electrical signal from the oscillation signal generator directly to the oscillator without passing the oscillating electrical signal through an intervening circuit.

10. The device of claim 1, wherein the received oscillating electrical signal is the same as the received oscillating electrical generated by the oscillation signal generator.

11. A device for generating an oscillatory motion of a mass, comprising:
   an oscillator that is configured to transform an oscillating electrical signal into a mechanical oscillation;
   an oscillation signal generator that is configured to generate the oscillating electrical signal and that is connected to the oscillator in an oscillation electrical signal transmitting manner; and
   a power source for providing operation power to the oscillation signal generator, the power source comprising a power sender and a power receiver, wherein the power sender is configured to wirelessly send the operation power to the power receiver, and the power receiver is configured to provide the wirelessly received operation power to the oscillation signal generator.

12. The device of claim 11, wherein the device comprises an oscillation sensor that is configured to sense a predetermined feature of the mechanical oscillation of the oscillator and to output a sensor signal representing the predetermined feature of the mechanical oscillation, wherein the oscillation sensor is connected to the oscillation signal generator in a sensor signal transmitting manner.

13. The device of claim 12, wherein the oscillation signal generator is configured to set a feature of the oscillating electrical signal dependent on the predetermined feature of the mechanical oscillation represented by the sensor signal.

14. The device of claim 12, wherein the oscillation sensor is connected to the oscillation signal generator in a wired or wireless sensor signal transmitting manner.

15. The device of claim 11, wherein the power source is provided outside of an oscillation system formed by the power receiver and the oscillator.

16. The device of claim 11, wherein the device comprises a mass that is connected to the oscillator in a mechanical oscillation transmitting manner, wherein the mass is one of a tool holder, a reactor holder, a conduit holder, a tool, a reactor and a conduit.

17. The device of claim 11, wherein the power receiver and the ultrasonic oscillator form an oscillation module system that is configured to be repeatedly separated from and connected to a power module system of the device that comprises the power sender.

18. A method for generating an oscillatory motion of a mass, comprising the steps of;
   generating an oscillating electrical signal with an oscillation signal generator,
   wirelessly sending the oscillating electrical signal from the oscillation signal generator directly to an oscillator,
   wirelessly receiving the sent oscillating electrical signal at the oscillator, and
   directly transforming the wirelessly received oscillating electrical signal into mechanical oscillation with the oscillator.

19. The method of claim 13, wherein a frequency of the frequency at which the oscillating electrical signal oscillates range between 80% and 120% of the resonant frequency of the oscillator or of the oscillator and the mass, optionally including the oscillation sensor.

20. The method of claim 13, wherein the wirelessly received oscillating electrical signal is the same as the oscillating electrical generated by the oscillation signal generator.

* * * * *